United States Patent [19]

Frey et al.

[11] Patent Number: 5,125,153
[45] Date of Patent: Jun. 30, 1992

[54] METHOD OF MAKING A HYBRID ELECTRONIC ARRAY

[75] Inventors: Raymond Frey, Zurich; Fredy Glaus, Zufikon; Fredy Heusler, Turgi; Jurg Steinmann, Walenstadt, all of Switzerland

[73] Assignee: Oerlikon-Contraves AG, Zurich, Switzerland

[21] Appl. No.: 611,017

[22] Filed: Nov. 9, 1990

[30] Foreign Application Priority Data

Nov. 9, 1989 [CH] Switzerland ............... 4068/89

[51] Int. Cl.⁵ ............................................. H05K 3/34
[52] U.S. Cl. ...................................... 29/840; 29/832; 156/289; 357/80; 427/259; 437/209
[58] Field of Search ................ 29/832, 840, 834; 156/289; 427/259; 357/80; 437/209

[56] References Cited

U.S. PATENT DOCUMENTS

| 4,294,009 | 10/1981 | Quintin et al. ............. 29/832 |
| 4,343,833 | 8/1982 | Sawae et al. .......... 427/259 X |
| 4,747,192 | 5/1988 | Rokurota ............... 29/840 X |
| 4,843,035 | 6/1989 | Takashima ............. 357/80 X |
| 4,845,405 | 7/1989 | Yamane et al. . |
| 4,978,811 | 4/1990 | Eichelberger ......... 437/209 X |

FOREIGN PATENT DOCUMENTS

| 3621796 | 1/1988 | Fed. Rep. of Germany . |
| 115553 | 9/1981 | Japan ................... 437/209 |
| 168232 | 7/1986 | Japan ................... 437/209 |
| 26879 | 2/1987 | Japan ................... 437/209 |
| 78250 | 3/1990 | Japan ................... 437/209 |

OTHER PUBLICATIONS

German Search Report.
English Language Abstract of Japan reference SHO 59-65490.
English Language Abstract of Japanese reference SHO 60-187070.
A High-Brightness GaP Green LED Flat-Panel Device for Character and TV Display, by NIINA et al., pages 1182-1185 of IEEE Transactions on Electronic Devices, vol. ED-26, No. 8 (Aug. 1979).

*Primary Examiner*—Carl J. Arbes
*Attorney, Agent, or Firm*—Sandler, Greenblum & Bernstein

[57] ABSTRACT

A method and apparatus for producing a highly packed hybrid array. The packing density of the hybrid array is increased by providing a barrier between closely adjoining strip conductors on a substrate. The barrier reduces the occurrence of short circuits between adjacent strip conductors when an adhesive that is used to glue a chip to the substrate is pushed out from under the chip.

28 Claims, 2 Drawing Sheets

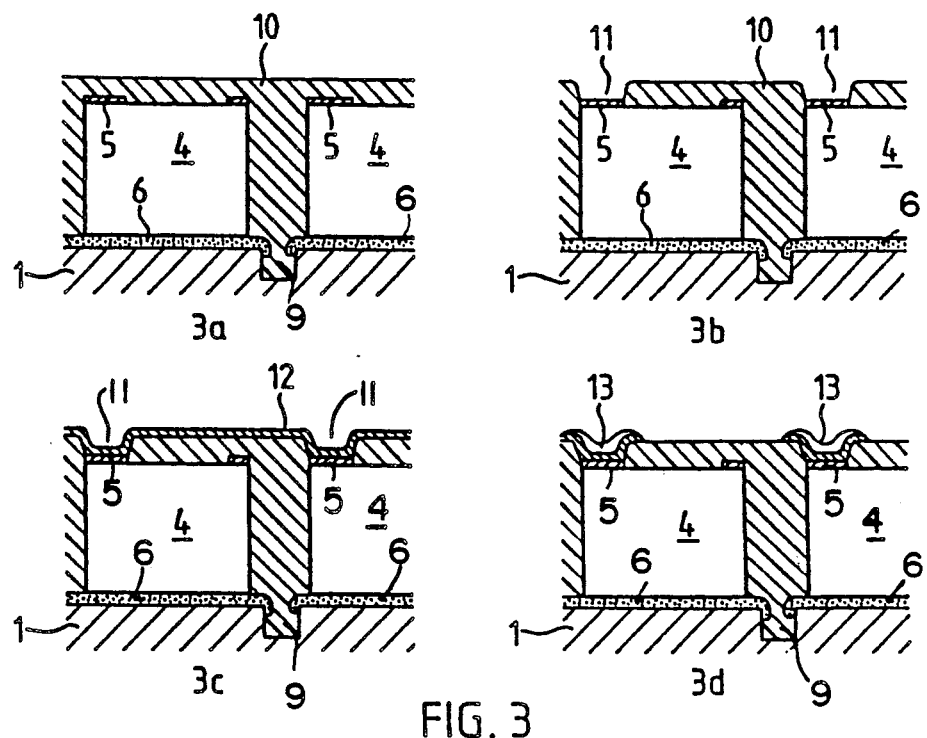
FIG. 3
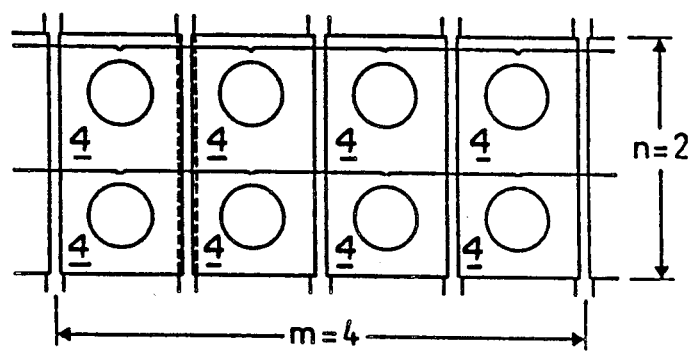
FIG. 4a
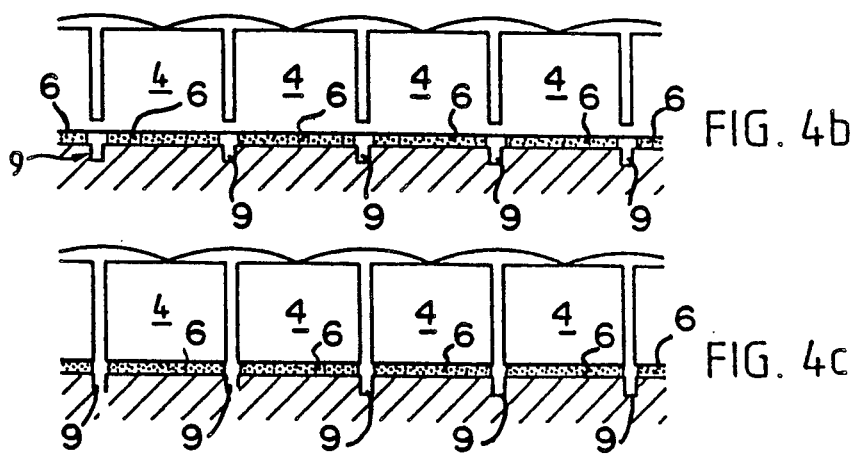
FIG. 4b
FIG. 4c

METHOD OF MAKING A HYBRID ELECTRONIC ARRAY

FIELD OF THE INVENTION

The present invention relates to a method and apparatus for manufacturing hybrid electronic circuits having a matrix-shaped or grouped disposition of function elements with a high packing density, and, in particular, to the manufacturing of an LED array.

DISCUSSION OF BACKGROUND AND RELEVANT INFORMATION

Conventional methods for manufacturing hybrid circuits consist of gluing chips, containing individual electronic function elements, on a substrate, such as a ceramic plate that is layered with strip conductors. An adhesive, such as an epoxy resin mixed with silver, is used to provide a conducting connection between the strip conductors and the chip. In order for the glued connection to conform with the mechanical and electrical requirements of the circuit, an appropriate amount of adhesive must be applied to the substrate and the chip must be slightly pressed down into the adhesive. In such a situation, it is likely that some of the adhesive will be pushed out from underneath the chip, particularly when one is working with very small chips, such as individual LEDs. Undesirable electrical connections are created if the protruding beads of adhesive touch adjacent strip conductors, or if the beads of adhesive touch adjacent chips. To prevent this situation, care must be exercised to ensure that a minimal distance is maintained between adjacent strip conductors, and thus, adjacent chips. Alternatively, the excess adhesive must be removed in a subsequent manufacturing step. In either case, the attainable packing density of the circuit is limited.

Normally, monolithic integration techniques are used for the manufacture of arrays consisting of identical function elements, i.e. a chip produced which contains all function units in the desired sequence and packing density. Electronic memory circuits are typically manufactured in this manner, because it results in high packing densities. However, if monolithic integration is supposed to be justifiable with respect to yield and profitability, one must be able to produce useable function units at a high yield and high packing density.

However, production yields are often too small and unprofitable with respect to the manufacture of chips that require a lot of energy, and thus, a relatively large amount of surface space. In many cases, the materials or the production methods used are simply not suitable to the task. This particularly applies to the manufacture of gallium-arsenide light emitting diode arrays (GaAs-LEDs), which today are usually produced by gluing individual LEDs onto a substrate.

The attainable packing density is a primary concern with present assembly methods. An LED can have a size of approximately, $0.25 \times 0.25 \times 0.18$ mm, for example, and produce a visible wavelength that is detectable by a human eye. When securing elements of such a small size, one must to apply the adhesive to practically the entire surface of the element. Otherwise, it is not possible to ensure that the element will be properly fastened to the substrate. Using present production methods, a portion of the adhesive is laterally pushed out from underneath the LED when the LED is positioned on the substrate, even if the dispensing of the adhesive is satisfactory metered and exactly positioned. Accordingly, the manufacture of LED arrays require a space of as much as twice their bearing surface, unless the pushed out beads of adhesive are removed in additional manufacturing steps. Thus, present state of the art manufacturing techniques only permit the production of LED arrays having a packing grid of approximately 1 mm; i.e., one LED per $mm^2$.

Since conventional manufacturing techniques result in low packing density LED arrays, wherein only approximately one quarter of the substrate surface forms an effective illuminated surface, images produced by such LED arrays are perceived by the human eye as being coarse, i.e., clearly composed of light dots. Accordingly, it is desirable to be able to manufacture high packing density GaAs-LED arrays in which the image quality of an image displayed by the LED array is increased. Further, it is desirable to be able to produce high resolution, small size displays.

SUMMARY OF THE INVENTION

It is an object of the present invention to manufacture arrays that combine the advantages of monolithic integration techniques (such as, for example, a higher packing density) while maintaining the benefits of processing individual chips (such as, for example, the removal of faulty function elements). A method according to the present invention results in a packing density that is considerably higher than is possible using conventional manufacturing techniques.

The present invention reduces the effects of adhesive beads that are pushed out from underneath components, using conventional materials and aids. The method of the present invention is usable in connection with many different types of chips from which an array is made. Where it is not practicable to use monolithic integration techniques to manufacture an array, because the yield of the functioning elements would be too low, and thus, the reject rate too high, the method of the present invention offers a chance of further processing individual blocks of function elements produced from monolithic integration techniques, without the need to separate them into individual elements. For example, the present invention enables the manufacture of GaAs-LED arrays, or other elements, of the same dimensions with a packing density of approximately 0.33 mm, i.e., approximately nine LEDs per $mm^2$.

An object of the present invention is to improve the packing density of a hybrid electronic array by placing means for blocking an electrical adhesive at selected zones on a substrate; depositing the adhesive on the substrate; positioning a function element on top of the adhesive between respective blocking means so that the function element is in electrical contact with the substrate; and then, separating undesired electrical contacts that form over the blocking means.

An advantage of the present method is that the blocking means, which are placed between strip conductors on the substrate that extend next to each other, have raised portions and are made from an electrically insulating material. Preferably, the blocking means are manufactured from a material, such as polyimide, that has a hardness that approximates that of the adhesive that is used to secure the function element to the substrate.

Another advantage of the present invention is that the adhesive that is applied to the substrate serves two functions. The adhesive serves to secure the function element to the substrate. In addition, the adhesive is made electrically conductive, such as for example, by mixing silver with an epoxy resin, so that the adhesive creates electrical connections between function elements.

Another advantage of the present invention is that the blocking means can be formed by cutting grooves into the substrate.

According to the method of the present invention, undesired electrical connections that form over the blocking means are removed by cutting the undesired electrical contact. A further advantage of the present invention is that when cutting the undesired electrical contact, one can cut into the blocking means without affecting the integrity of the array.

Another object of the present invention is to construct an electronic array using either individual chips that have been cut from a whole semiconductor wafer, or a block wafer that is cut from a whole semiconductor wafer. If a block wafer is used, the block wafer is cut so as to have side lengths of m and n function elements, wherein the side lengths m and n comprise either a power of 2, or, whole number fractions of a side length of the array.

Another advantage of the present invention is that the luminous surface of the array can be maximized by locating a contact surface on a side of the function element that faces away from the substrate. The contact surface of one function element is connected to the contact surface of another function element by a wire, using either a multi-stitch or planar bonding operation.

Another object of the present invention is to create a hybrid electronic array, such as a GaAs-LED array, comprising a substrate; means for blocking an electrically conductive adhesive that is deposited on the substrate; and means for positioning function elements on top of the adhesive at predetermined locations on the substrate. Such a display is ideal for use in devices that require small displays having a high resolution, such as is needed to display fire control information in a weapons system.

An advantage of the electronic array is that the blocking means comprises a raised portion that is positioned between a row of the function elements. Alternatively, the blocking means can comprise a recess that is made into the substrate.

Another advantage of the present invention is that any undesired electrical contact bridge that forms over the blocking means is easily separated by cutting the electrical contact.

BRIEF DESCRIPTION OF THE DRAWINGS

The foregoing and other objects, features, and advantages of the present invention will be apparent from the following more particular description of the preferred embodiment as illustrated in the accompanying drawings, in which reference characters refer to the same parts throughout the various views, and wherein:

FIGS. 3a-3d illustrate products of individual steps of the present invention for the production of planar bondings on the side of LEDs that face away from the substrate; and FIGS. 4a-4c illustrate schematic views of a third embodiment of an array made using blocks of LEDs.

DETAILED DESCRIPTION OF A PREFERRED EMBODIMENT

Figure 1:
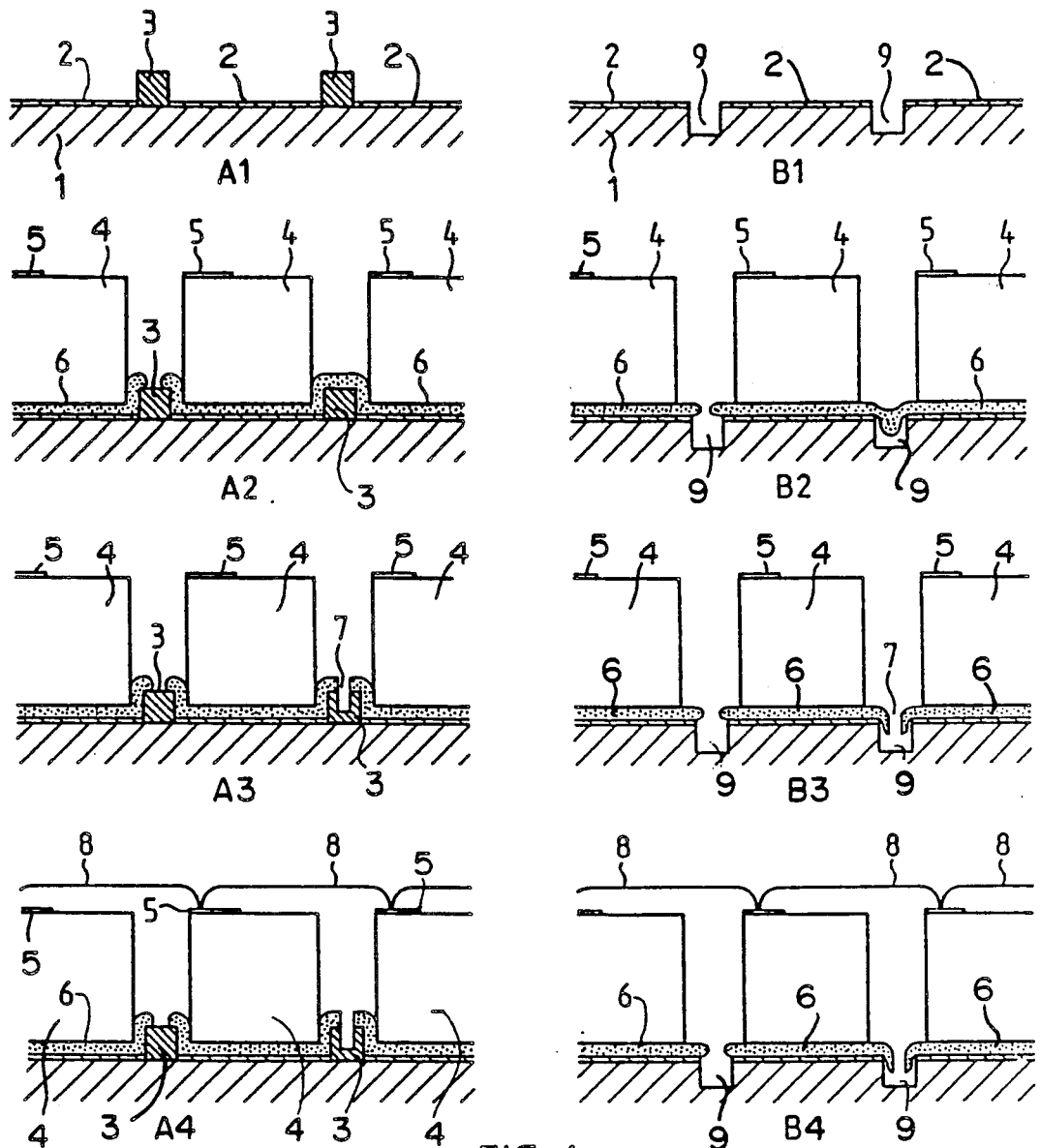
FIGS. 1(A1)-1(A4) and 1(B1)-1(B4) illustrate schematic views of individual manufacturing steps of the present invention for two embodiments, labelled as A and B.

The method of the present invention includes the separation of strip conductors using a means for blocking, on which chips are to be glued using an electrically conducting adhesive. The blocking means reduces the possibility of contact being made (i.e., short circuit) between adhesive beads that are pushed out from underneath the chip and adjacent strip conductors, or between the adhesive beads of adjacent chips. In the few cases where such contact still occurs, the blocking means facilitates subsequent separation of the adhesive.

The method of the present invention will be described below with reference to the production of a GaAs-LED array. In the example, the light emitting diode array consists of a square of $128 \times 128$ individual GaAs-LEDs, each having a size of approximately $0.25 \times 0.25 \times 0.18$ mm. The grid size is approximately 0.33 mm, resulting in a distance between LEDs of approximately 0.08 mm. A substrate used in the example comprises a ceramic plate, in which a matrix of 128 parallel strip conductors having widths of approximately 0.28 mm are spaced from each other by approximately 0.05 mm. The LEDs are glued to the strip conductors using an electrically conducting adhesive, such as an epoxy resin that is mixed with silver. In the present example, the LEDs have bond pads on their surfaces, which are connected to columns of the array by means for multi-stitch bonding (also referred to as interlaminar bonding).

Such a manufactured LED array inevitably creates undesired conducting connections, the connections being formed by the adhesive that is pressed out from underneath the LEDs. The undesired connections are created in the 0.05 mm spaces that are found between the strip conductors, during the gluing of the LEDs. One possible solution is to reduce the amount of adhesive that is dispensed. However, if less adhesive is dispensed during the manufacturing process, so as to prevent short circuits of this type, it is no longer guaranteed that the adhesive will be evenly distributed over the entire surface of the LEDs. Thus, the quality of the adhesion bond may be reduced. In order to later remove the short circuit during the manufacturing process, the adhesive must be cut away, down to the ceramic material of the substrate, which inevitably results in some of the ceramic material being removed. However, conventional cutting tools are not available which can cut both the silver epoxy and the ceramic material and still have a long service life. Furthermore, the possibility exists that the cutting tool can smear the adhesive and damage the LEDs.

An LED array is manufactured according to the method of the present invention, as follows:

First, means for blocking an adhesive applied to a ceramic substrate 1 are positioned between strip conductors 2 on top of a ceramic substrate 1. Thereafter, LEDs 4 are glued to the strip conductors. Then, an initial determination is made as to whether any of the connections between the strip conductors are conductive. This step is accomplished by measuring the resistance of the individual strip conductors.

Any adjoining strip conductors that are electrically connected together are separated using a conventional mechanical separation tool. After the step of separating conductive conductors is completed, the strip conductors are retested for short circuits. If this test indicates that adjacent conductors are still shorted together, other reasons may exist for the shorts, such as a defect in the LED itself. Therefore, these shorted conductors are rejected. The LEDs that are not shorted are then connected to form columns of the array on a surface which faces away from the substrate 1.

In a slight variation of the above procedure, the step of initially measuring the conductivity of adjacent connections may be omitted. Instead of making an initial determination of whether any shorts exist, all the strip conductors are separated by a milling process. Thus, this variation eliminates the need to conduct extensive testing to locate short-circuit strip conductors. However, once the milling operation is completed, the adjacent conductors are tested, so as to locate shorts that may exist for reasons unrelated to a shorted conductor, such as a defect in the LED itself.

Two embodiments, labelled as A and B in FIG. 1, are disclosed. In embodiment A, shown in FIG. 1(A1), barriers 3, having a cross section of approximately 0.05×0.05 mm, are applied between strip conductors 2 to substrate 1, using a standard photo-chemical method. The material of the barrier 3 is selected so as to be electrically insulating and to be similar to adhesive 6, once it has hardened, that is used to mechanically secure LEDs 4 to the substrate 1. A suitable barrier material is polyimide. However, other chemicals are equally suitable.

In embodiment B, shown in FIG. 1(B1), grooves 9, that are approximately 0.05 mm wide and 0.05 mm deep, are cut into the substrate 1 between the strip connectors 2. In this embodiment, the substrate 1 has been milled. However, other methods of forming a groove 9 in the substrate 1 may be used.

After the substrate 1 has been prepared, the LEDs 4 are positioned between the blocking means (such as, the barrier 3 or the groove 9) and glued to the strip conductors 2, using the adhesive 6. In the present invention, the adhesive comprises an epoxy resin that has silver mixed therein. However, other electrically conductive adhesives can be used. It is noted that while the silver mixed epoxy resin 6 normally takes a relatively long time to harden, it dries very quickly when it is dispensed in small quantities. Hence, it is important that the components (i.e., LEDs 4) are pressed into the droplet immediately after the adhesive 6 has been applied. The application of the drop of adhesive 6 and the application of the LED 4 must be repeated for each LED 4. The adhesive 6 is laterally pushed out from underneath the LED 4 when the LED 4 is pressed into the adhesive 6. In embodiment A, the pushed out adhesive 6 collects between the barriers 3 and LED 4, as shown with respect to the left-most barrier 3 of FIG. 1(A2). In the worst case, the adhesive 6 rises above the barrier 3, covering the barrier 3, as shown with respect to the right-most barrier 3 of FIG. 1(A2). The undesired collection of adhesive 6 may entail problems with regard to the accurate placement of components. Thus, in such situations, it is recommended that embodiment B, shown in FIGS. 1(B1)–1(B4), wherein grooves 9 are provided in the substrate 1, be used. If the substrate 1 has grooves 9 formed between the strip conductors 2, the adhesive 6 that is pushed out from underneath the LEDs 4 hardens in the form of a bead, or a drop, at the edge of the groove, as shown with respect to the left-most groove 9 in FIG. 1(B2). Alternatively, if a large amount of adhesive 6 is push out from underneath the LEDs 4, a bridge may be formed across the groove 9, without the adhesive 6 reaching the bottom of the groove 9, because of cohesion and surface tension of the resin, as shown with respect to the right-most groove 9 in FIG. 1(B2).

According to one manufacturing procedure of the present invention, the resistances of the individual strip conductors 2 are initially measured. Strip conductors 2 having a resistance below a predetermined value are considered to be connected with adjacent strip conductors and must be separated. Milling cuts, having a width of approximately 0.03 mm are performed on the tested conductors that indicate they are shorted to adjacent conductors. Alternatively, in the manufacturing method in which the initial testing of adjacent conductors is not performed, all strip conductors are separated from each other by milling cuts.

In embodiment A, which employs an insulation material barrier 3, the milling cuts are made into the barrier 3 to a depth of approximately 0.03 mm, as shown in FIG. 1(A3). In embodiment B, wherein a groove 9 is provided in the substrate 1, the milling cuts are made to a depth of approximately 0.04 mm, as shown in FIG. 1(B3). In neither case is the hard ceramic material of the substrate 1 cut. Thus, the milling operation can be performed using conventional cutting blades, because the materials to be milled, for example, epoxy resin (adhesive) and polyimide (barrier) are relatively soft in comparison to the substrate. Cutting blades with a width of a few one-hundredths of a millimeter are easily produced for such soft materials and are economical to purchase. Such blades also have a relatively long service live, further reducing the effective cost of such a blade, especially when compared against cutting blades used for milling the hard ceramic material of the substrate 1, which, for various reasons, generally can not be milled to a width of less than 0.05 mm.

After the milling operation is completed, the arrays are tested and rejects are removed. Thereafter, the LEDs are connected with each.

The LEDs are connected in one of several ways. A back surface of each LED that faces away from the substrate 1 has a square contact layer 5. One way of connecting the LEDs is to connect the square contact layer 5 with a wire 8, using a conventional bonding process, as shown in FIGS. 1(A4) and 1(B4). In an LED array constructed by the present invention, the bonding spot has a size of approximately ¼ of the diameter of the LED surface, because (a) an appropriate thickness is necessary for the required current draw of each LED 4; (b) the bonding spot must provide adequate mechanical strength for the bonded wires; and (c) because the wire 8 is squeezed to a thickness of approximately 0.05 mm during the ultrasound bonding operation, thus increasing the diameter of the flattened wire 8. Furthermore, the contact spot should provide space for two connections, plus a spare connection. It is noted that the contacts are preferably laid out in such a manner as to equalize the current distribution in the LED array.

Figure 2:
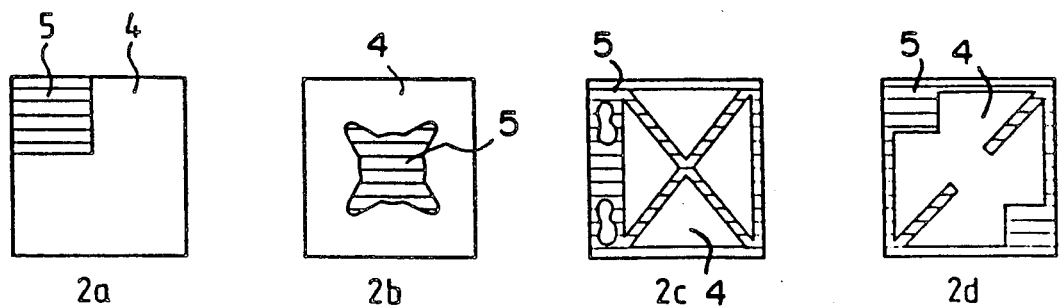
FIGS. 2a-2d show various contact surfaces on a side of an LED that faces away from a substrate shown in FIGS. 1.

FIGS. 2a–2d illustrate various contact surface shapes on the top of the LEDs 4. However, the contact surface shapes are not limited to those shown in FIG. 2. Because the contact surfaces 5 and the wires 8 cover a portion of a luminous surface of the LEDs 4, they reduce the LED's illumination power. Thus, a one-sided peripheral contact layer connection, as shown in FIG. 2c, is preferably employed because it maximizes the luminous surface of the LED 4.

Impairment of the luminous surfaces can only be prevented by locating the contact surfaces 5 on a side surface of the LEDs 4 and by having the bonding wires 8 extend along the side surface of the LEDs 4. However, while such a connection is envisioned to be within the scope of the present invention, it is not presently possible to perform such a connection using conventional bonding equipment. A compromise connection, which functions to minimize luminous impairment, can be achieved by making a single connection of each LED 4 to the substrate 1, so as to leave more of the luminous surface of the LED exposed. However, the quest for obtaining high packing densities makes such an arrangement impracticable.

The one-sided peripheral contact surface 5 of the LEDs 4 shown in FIG. 2c are connected using an interlaminar bonding operation. This technique requires that special attention be paid to the problem of different expansion coefficients of the various materials. The following steps, illustrated in FIGS. 3a–3d, can be performed after the milling operation discussed above and shown in FIG. 1(B3), to ensure a good planar bond.

First, one places an electrically insulating, transparent material 10, such as, for example polyimide, onto the substrate 1 which is provided with elements 4, as shown in FIG. 3a. Then, 128 parallel grooves 11 are etched into the transparent material 10 above the contact layers 5 using a conventional photo-chemical (i.e., sputtering) process, as shown in FIG. 3b. The array surface is then coated with a layer, such as an aluminum layer 12 (see FIG. 3c). The aluminum layer is then etched to remove the aluminum layer that was originally formed between the parallel grooves 11, using a conventional photo-chemical process, so that an aluminum layer connection covered with photoresist 13 remains only above and between the contact surfaces 5, as shown in FIG. 3d.

In a third embodiment of the manufacturing method described above, integrated blocks having a plurality of function elements, which may be of the same or different sizes, are processed. This embodiment, illustrated in FIGS. 4a–4c, assumes that the function elements can be provided on the wafer in the same density as described above with respect to the LED array, such as, for example a grid wherein the distance between elements measures approximately 0.33 mm. If the yield of operational LEDs 4 on the wafer manufactured according to the present invention is close to 100%, a wafer section corresponding to the desired array (for example, 128×128 LEDs) can be cut from the wafer and mounted on a substrate, and the critical assembly of the many individual LEDs 4 would not be necessary.

However, it is nearly impossible to produce a whole wafer that is defect-free. A partial solution is to cut out from the wafer block LEDs which are 100% operative, and then place the wafer block on a substrate. The size of the blocks (i.e., chips) comprise, preferably, m×n LEDs, wherein m and n are preferably a power of 2, or, a whole number fraction of the length of a side of the array to be manufactured. For example, FIG. 4a illustrates that m equals 4 and n equals 2. The determination of the block size is made by means of a suitable statistical model, so that the wafer can be optimally used, depending on the distribution of defective LEDs. Further, depending on the environment in which the LED array is to used, it may be possible to tolerate a certain number of defective elements within a wafer block, up to a predetermined maximum value.

When assembling the wafer blocks, such as, for example LED blocks having integrated connections, it is only necessary to place the adhesive on the outside LEDs for retaining the wafer block on the substrate. The adhesive is placed on the strip connectors on the substrate by means of adhesive bridges. This offers sufficient stability for blocks that are not very large in size. In this embodiment, as with the assembly of individual elements in the first and second embodiments, there is the danger of short circuits occurring between the strip connectors. Just as in the method described above in connection with the production of single LEDs, the substrate can be appropriately prepared so that any short circuits that occur during the manufacturing process can be easily removed. However, when assembling wafer blocks to a substrate, one should not employ the barriers 3 on the substrate to act as the blocking means, since the surface of the substrate must be level for assembling the wafer blocks. Accordingly, when assembling wafer blocks onto a substrate, the blocking means should comprise grooves 9 that are formed in the substrate between the strip connectors of the substrate.

After the wafer blocks have been glued onto the substrate, the individual LEDs of a wafer block must be separated in the direction of the strip connectors on the substrate (or, at least, to a depth of 90% of the thickness of the LEDs, as shown in FIG. 4b), so that current can be directed to only the desired individual LED elements of the matrix. It should be noted that when a groove 9 is formed in the substrate 1, a milling operation can be performed to totally separate the individual LEDs from each other, because the milling operation can cut through the wafer block until the cutting blade of the milling machine enters the groove 9 on the substrate, as shown in FIG. 4c. Such an operation ensures that all possible short circuits are eliminated. After the blocks have been assembled and separated parallel to the strip conductors, further processing of the array proceeds in the same way as that described above with respect to the production of an array assembled using individual elements.

Manufacturing arrays using block assembly permits the production of an array having any desired shape and/or size. In particular, such a construction facilitates the production of linear arrays, because it permits the grids to be positioned even closer together than when an array is produced using individual chips. Thus, the method of the present invention permits the development of very small displays that have high resolutions.

To further improve the reliability of the entire display, the substrate preferably has strip conductors placed on its underside, which extend orthogonally to the strip conductors on the top, but which are parallel to the bonding wires 8 on via the top of the LEDs 4. The strip conductors are connected at an edge of the matrix with the connecting wires 8, or interlaminar bonds, formed on the top of the LEDs 4. Such an arrangement permits the supply of current to the matrix from both sides. Thus, if a bonding wire on one side becomes defective, it is still possible to supply the entire column with current.

Arranging the power connections on two sides of the substrate permits a relatively simple connection with other circuits. In an advantageous manner, control electronics can be positioned on a substrate that is slightly offset underneath the LED array, resulting in a very compact construction. Such a compact display is desirable for use in complex instrumentations, such as, for instance, displaying fire control information in weapons systems, because they can be blended into the field of view, for instance, of a gun layer.

Finally, although the invention has been described with reference of particular means, materials and embodiments, it is to be understood that the invention is not limited to the particulars disclosed and extends to all equivalents within the scope of the claims.

What is claimed is:

1. A method for manufacturing a hybrid electronic array, comprising the steps of:
    placing means for blocking an electrical adhesive at predetermined zones on a substrate;
    depositing the adhesive on the substrate;
    positioning a function element on top of the adhesive, between respective blocking means, so that the function element is in electrical contact with the substrate; and
    separating undesired electrical contacts that form over the blocking means.

2. The method of claim 1, wherein the step of placing the blocking means on the substrate comprises placing the blocking means between strip conductors that extend next to each other.

3. The method of claim 2, wherein the step of placing the blocking means between the strip conductors comprises placing raised portions between the strip conductors, the raised portions being made of an electrically insulating material.

4. The method of claim 3, wherein the electrically insulating material of the blocking means comprises the step of manufacturing the blocking means with a material that has a hardness that approximates that of the adhesive that is used.

5. The method of claim 1, wherein the step of depositing an adhesive on the substrate comprises using an epoxy resin that has silver mixed therein.

6. The method of claim 4, wherein the step of placing raised portions comprises the step of depositing polyimide on the substrate.

7. The method of claim 2, wherein the step of placing blocking means on the substrate comprises cutting grooves into the substrate.

8. The method of claim 1, wherein the step of separating undesired electrical contacts comprises cutting the undesired electrical contact so as to eliminate shorts that form over the blocking means.

9. The method of claim 8, wherein the step of cutting the undesired electrical contact further comprises cutting into the blocking means.

10. The method of claim 1, wherein the step of positioning a function element of the substrate comprises the step of positioning each individual function element on the substrate.

11. The method of claim 1, wherein the step of positioning a function element on the substrate comprises the step of positioning an integrated wafer block, having a plurality of function elements, on the substrate.

12. The method of claim 11, wherein the step of positioning an integrated wafer block on the substrate comprises the step of cutting the wafer block from an originally produced wafer, the wafer block having first and second side lengths having m and n function elements, respectively, M and N being integers.

13. The method of step 12, wherein the step of cutting the integrated wafer block to have side lengths of m and n function elements comprises the step of cutting the integrated wafer block so that the side lengths m and n comprise a power of 2.

14. The method of step 12, wherein the step of cutting the integrated wafer block to have side lengths of m and n function elements comprises the step of cutting the integrated wafer block so that the side lengths m and n comprise whole number fractions of the side length of the array.

15. The method of claim 11, wherein the step of positioning the wafer block on the substrate comprises the steps of:
    gluing the wafer block to the substrate with the adhesive; and
    separating the plurality of function elements from each other.

16. The method of claim 1, wherein the step of positioning a function element of the substrate comprises the step of placing an individual chip on the substrate, the individual chip having a contact surface on a side that faces away from the substrate, the contact surface of one individual chip being connected to a contact surface of another individual chip by a wire.

17. The method of claim 16, wherein the step of connecting one individual chip to another individual chip comprises the step of multi-stitch bonding the wire to each individual chip.

18. The method of claim 16, wherein the step of connecting one individual chip to another individual chip comprises the step of planar bonding.

19. The method of claim 15, wherein the step of separating the plurality of function elements from each other comprises performing a separation procedure that extends through the adhesive into the blocking means.

20. A method for manufacturing a hybrid electronic array, comprising the steps of:
    placing a plurality of electrically non-conductive barriers at predetermined zones on a substrate;
    depositing an electrically conductive adhesive on the substrate;
    positioning a plurality of function elements over the substrate so that the function elements are positioned between the barriers;
    pressing the function elements into the adhesive so that the function elements are in electrical contact with the substrate;
    separating undesired electrical contacts that form over the blocking means; and
    electrically connecting the function elements together in a predetermined arrangement.

21. The method of claim 20, further comprising the step of testing adjacent contacts after the function elements are pressed into the adhesive so as to determine whether any undesired electrical contacts exist.

22. The method of claim 21, wherein the step of testing adjacent contacts comprises determining the resistivity of adjacent contacts is below a predetermined value.

23. The method of claim 20, wherein the step of separating undesired electrical contacts comprises the step of cutting the undesired electrical contact with a milling tool, wherein the milling tool cuts into the barrier.

24. The method of claim 23, further comprising the step of measuring the resistivity of adjacent contacts after the separation step is performed to determine whether any defective function elements exist.

25. A method for manufacturing a hybrid electronic array, comprising the steps of:

obtaining a substrate that has a plurality of grooves formed therein at predetermined zones;

depositing an electrically conductive adhesive on the substrate;

positioning a plurality of function elements over the substrate so that the function elements are positioned between the barriers;

pressing the function elements into the adhesive so that the function elements are in electrical contact with the substrate;

separating undesired electrical contacts that form over the blocking means; and connecting the function elements together in a predetermined arrangement.

26. The method of claim 25, further comprising the step of testing adjacent contacts after the function elements are pressed into the adhesive so as to determine whether any undesired electrical contacts exist.

27. The method of claim 26, wherein the step of testing adjacent contacts comprises determining the resistivity of adjacent contacts is below a predetermined value.

28. The method of claim 25, further comprising the step of measuring the resistivity of adjacent contacts after the separation step is performed to determine whether any defective function elements exist.

* * * * *